(12) United States Patent
Kim et al.

(10) Patent No.: US 11,987,740 B2
(45) Date of Patent: May 21, 2024

(54) SILICON NITRIDE FILM ETCHING COMPOSITION AND ETCHING METHOD USING THE SAME

(71) Applicant: ENF TECHNOLOGY CO., LTD., Yongin-si (KR)

(72) Inventors: Dong Hyun Kim, Yongin-si (KR); Hyeon Woo Park, Yongin-si (KR); Sung Jun Hong, Yongin-si (KR); Myung Ho Lee, Hwaseong-si (KR); Myung Geun Song, Yongin-si (KR); Hoon Sik Kim, Yongin-si (KR); Jae Jung Ko, Seoul (KR); Myong Euy Lee, Yongin-si (KR); Jun Hyeok Hwang, Seoul (KR)

(73) Assignee: ENF Technology Co., Ltd., Yongin-si (KR)

( * ) Notice: Subject to any disclaimer, the term of this patent is extended or adjusted under 35 U.S.C. 154(b) by 220 days.

(21) Appl. No.: 17/446,408

(22) Filed: Aug. 30, 2021

(65) Prior Publication Data

US 2022/0089951 A1    Mar. 24, 2022

(30) Foreign Application Priority Data

Sep. 21, 2020    (KR) .................. 10-2020-0121512

(51) Int. Cl.
*C09K 13/06* (2006.01)
*H01L 21/311* (2006.01)

(52) U.S. Cl.
CPC ........ *C09K 13/06* (2013.01); *H01L 21/31111* (2013.01)

(58) Field of Classification Search
None
See application file for complete search history.

(56) References Cited

U.S. PATENT DOCUMENTS 5,993,532 A * 11/1999 Broderick .............. C08G 77/12
423/325
2012/0171805 A1* 7/2012 Hu ........................ H01L 31/068
257/E31.001

FOREIGN PATENT DOCUMENTS

| CA | 2727114 A1 * | 2/2010 | ............ C07F 7/0859 |
|---|---|---|---|
| KR | 10-2010-0091974 A | 8/2010 | |
| KR | 10-2013-0071095 A | 6/2013 | |
| KR | 10-2018-0109745 A | 10/2018 | |
| KR | 10-2019-0142077 A | 12/2019 | |
| KR | 10-2020-0026716 A | 3/2020 | |
| SL | 23292 A * | 9/2010 | ............... C07F 9/00 |

OTHER PUBLICATIONS

Notice of Allowance in Korean Application No. 1020200121512 dated Sep. 30, 2021 in 2 pages.

* cited by examiner

*Primary Examiner* — Allan W. Olsen
(74) *Attorney, Agent, or Firm* — Knobbe, Martens, Olson & Bear, LLP

(57) ABSTRACT

Provided are a silicon nitride film etching composition, a method of etching a silicon nitride film using the same, and a manufacturing method of a semiconductor device. Specifically, a silicon nitride film may be highly selectively etched as compared with a silicon oxide film, and when the composition is applied to an etching process at a high temperature and a semiconductor manufacturing process, not only no precipitate occurs but also anomalous growth in which the thickness of the silicon oxide film is rather increased does not occur, thereby minimizing defects and reliability reduction.

13 Claims, No Drawings

SILICON NITRIDE FILM ETCHING COMPOSITION AND ETCHING METHOD USING THE SAME

CROSS-REFERENCE TO RELATED APPLICATIONS

This application claims priority under 35 U.S.C. § 119 to Korean Patent Application No. 10-2020-0121512, filed on Sep. 21, 2020, in the Korean Intellectual Property Office, the disclosure of which is incorporated herein by reference in its entirety.

TECHNICAL FIELD

The following disclosure relates to a silicon nitride film etching composition, an etching method of a silicon nitride film using the same, and a manufacturing method of a semiconductor device.

BACKGROUND

A silicon oxide film ($SiO_2$) and a silicon nitride film ($SiN_x$) are a representative insulating film used in a semiconductor manufacturing process. Of the two, the silicon oxide film is used as a cap layer, a spacer layer, or a hard mask layer in a semiconductor device. The silicon nitride film and the silicon nitride film may be used alone or as a laminate in which one or more layers of silicon oxide film and one or more layers of silicon nitride film are alternately laminated. When manufacturing semiconductors, the silicon nitride layers and silicon oxide layers may be etched.

The disclosure of this section is to provide background information relating to the present disclosure. Applicant does not admit that any information contained in this section constitutes prior art.

SUMMARY

An embodiment of the present invention is directed to providing a silicon nitride film etching composition having a high etch selection ratio for a silicon nitride film.

Another embodiment of the present invention is directed to providing a stabilized silicon nitride film etching composition having a small change in an etch rate and an etch selection ratio for a silicon nitride film, even in the case of an increased etch processing time or repeated use.

Another embodiment of the present invention is directed to providing a silicon nitride film etching composition which produces no precipitate during etching.

Still another embodiment of the present invention is directed to providing a method of etching a silicon nitride film using the silicon nitride film etching composition and a manufacturing method of a semiconductor device.

In one general aspect, a silicon nitride film etching composition includes: a phosphoric acid, silsesquioxane, and a residual amount of water.

In the silicon nitride film etching composition according to an example embodiment of the present invention, the silsesquioxane may be a compound represented by the following Chemical Formula 1:

 [Chemical Formula 1]

wherein
n is an integer of 6, 8, 10 or 12; and
$R^1$ is independently of each other hydrogen, a halogen, cyano, nitro, hydroxy, $C_{1-20}$ alkyl, $C_{1-20}$ alkoxy, $C_3$-$C_{20}$ cycloalkyl, $C_3$-$C_{20}$ heterocycloalkyl, $C_3$-$C_{20}$ heteroaryl, $C_6$-$C_{20}$ aryl, $C_{1-20}$ aminoalkyl, or

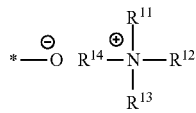

in which $R^{11}$ to $R^{14}$ are independently of one another hydrogen, $C_{1-20}$ alkyl, or $C_{1-20}$ hydroxyalkyl.

In the silicon nitride film etching composition according to an example embodiment of the present invention, the compound represented by Chemical Formula 1 may be a compound wherein n is an integer of 6 or 8, and $R^1$ is independently of each other $C_{1-20}$ alkyl, $C_{1-20}$ aminoalkyl, or

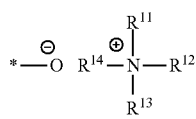

in which $R^{11}$ to $R^{14}$ are independently of one another hydrogen or $C_{1-20}$ alkyl.

In the silicon nitride film etching composition according to an example embodiment of the present invention, the compound represented by Chemical Formula 1 may be a compound wherein $R^1$ is independently of each other $C_{1-7}$ alkyl, $C_{1-7}$ aminoalkyl, or

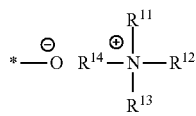

in which $R^{11}$ to $R^{14}$ are independently of one another hydrogen or $C_{1-7}$ alkyl.

In the silicon nitride film etching composition according to an example embodiment of the present invention, the compound represented by Chemical Formula 1 may be a compound wherein at least one of $R^1$ is

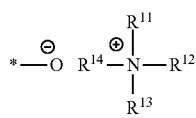

and the remaining is independently of each other $C_{1-7}$ alkyl, $C_{1-7}$ aminoalkyl, or

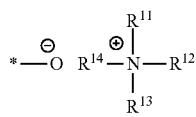

in which $R^{11}$ to $R^{14}$ are independently of one another hydrogen or $C_{1-7}$ alkyl.

In the silicon nitride film etching composition according to an example embodiment of the present invention, the silicon nitride film etching composition may include 60 to 95 wt % of the phosphoric acid, 0.01 to 5.00 wt % of the silsesquioxane, and a residual amount of water, with respect to the total weight.

The silicon nitride film etching composition according to an example embodiment of the present invention may further include an alcoholic solvent.

The silicon nitride film etching composition according to an example embodiment of the present invention may further include an inorganic acid, a derivative thereof, or a combination thereof.

The silicon nitride film etching composition according to an example embodiment of the present invention may further include an ammonium-based compound.

The silicon nitride film etching composition according to an example embodiment of the present invention may have a silicon nitride film/oxide film etch selection ratio of 500 or more.

The silicon nitride film etching composition according to an example embodiment of the present invention may have an etch rate for the silicon nitride film of 20 to 500 i/min and an etch rate for the silicon oxide film of 0 to 0.5 Å/min.

The silicon nitride film etching composition according to an example embodiment of the present invention may have an etch rate drift of the silicon nitride film after a repeated etching process satisfying the following Relation 1:

$$\Delta ERD_{SiNx} \leq 1\%$$ [Relation 1]

wherein $\Delta ERD_{SiNx}$ is an etch rate drift relative to an initial etch rate for a silicon nitride film.

In another general aspect, a method of selectively etching a silicon nitride film as compared with a silicon oxide film using the silicon nitride film etching composition is provided.

In still another general aspect, a manufacturing method of a semiconductor device includes an etching process performed using the silicon nitride film etching composition described above.

Other features and aspects will be apparent from the following detailed description and the claims.

DETAILED DESCRIPTION OF EMBODIMENTS

Hereinafter, the silicon nitride film etching composition according to embodiments of the present invention will be described in detail. Here, technical terms and scientific terms used in the present specification have the general meaning understood by those skilled in the art to which the present invention pertains unless otherwise defined, and a description for the known function and configuration which may unnecessarily obscure the gist of the present invention will be omitted in the following description.

The singular form used in the present specification may be intended to also include a plural form, unless otherwise indicated in the context.

In addition, units used in the present specification without particular mention are based on weights, and as an example, a unit of % or ratio refers to a wt % or a weight ratio and wt % refers to wt % of any one component in a total composition, unless otherwise defined.

In addition, the numerical range used in the present specification includes all values within the range including the lower limit and the upper limit, increments logically derived in a form and span in a defined range, all double limited values, and all possible combinations of the upper limit and the lower limit in the numerical range defined in different forms. Unless otherwise defined in the specification of the present invention, values which may be outside a numerical range due to experimental error or rounding of a value are also included in the defined numerical range.

The term of the present specification "comprise" is an open-ended description having a meaning equivalent to the term such as "is/are provided", "contain", "have", or "is/are characterized", and does not exclude elements, materials or processes which are not further listed.

The term of the present specification "silsesquioxane" refers to a compound including a siloxane structure composed of a Si—O—Si bond, and may be produced by a hydrolysis-polymerization method using trialkoxysilane, tetraalkoxysilane or trihalosilane, silicic acid, silica, and the like.

The term of the present specification "etch selection ratio ($E_{SiNx}/E_{SiO2}$)" refers to a ratio of an etch rate of a silicon nitride film ($E_{SiNx}$) to an etch rate of a silicon oxide film ($E_{SiO2}$). In addition, when the etch rate of a silicon oxide film is close to zero or has a high numerical value of the etch selection ratio, it means that a silicon nitride film may be selectively etched.

The term of the present specification "change in etch selection ratio" refers to an absolute value of a difference between an etch selection ratio and an initial etch selection ratio, when an etching process is repeatedly performed twice or more using the same silicon nitride film etching composition.

The term of the present specification "etch rate drift (ΔERD)" refers to a rate of change of an etch rate relative to an initial etch rate, when an etching process is repeatedly performed twice or more using the same silicon nitride film etching composition. Generally, as an etching process is repeatedly performed, etching performance, that is, an etch rate tends to be decreased, and thus, it is defined as a drift, and the rate of change is also interpreted as having the same meaning, of course. Specifically, the etch rate drift may be derived from the following Equation 1:

$$\Delta ERD = [1 - \{(\text{etch rate when repeatedly performing etching process } n \text{ times or more})/(\text{initial etch rate})\}] \times 100$$ [Equation 1]

The terms of the present specification "alkyl", "alkoxy", and substituents including alkyl include both forms of straight chain and branched chain.

The term of the present specification "cycloalkyl" refers to a monovalent group derived from a completely saturated or a partially unsaturated hydrocarbon ring having 3 to 10 carbon atoms.

The term of the present specification "heterocycloalkyl" refers to a monovalent cycloalkyl group derived from a monocyclic or polycyclic non-aromatic ring containing one or more atom or functional groups selected from B, N, O, S, Se, —P(=O)—, —C(=O)—, Si, P, and the like.

The term of the present specification "aryl" refers to a monovalent group derived from a hydrocarbon ring.

The term of the present specification "heteroaryl" refers to a monovalent group derived from an aromatic ring, and may be a monovalent aryl group derived from a monocyclic or polycyclic aromatic ring containing one or more atoms or functional groups selected from B, N, O, S, Se, —P(=O)—, —C(=O)—, Si, P, and the like.

The term of the present specification "halogen" or "halo" refers to a fluorine, chlorine, bromine, or iodine atom.

The term of the present specification "aminoalkyl" refers to an alkyl group containing an amino group (*—NR'R"). Herein, R' and R" are independently of each other hydrogen or $C_{1-20}$ alkyl.

The term of the present specification "hydroxyalkyl" refers to an alkyl group containing a hydroxyl group (*—OH).

A silicon nitride film and a silicon oxide film are representative insulating films used in a semiconductor manufacturing process. A silicon nitride film may be laminated on a surface such as a silicon oxide film, a polysilicon film, and a silicon wafer as a thin film mainly by a chemical vapor deposition (CVD) process, and the silicon nitride film formed as such may be removed by an etching process.

For etching of the silicon nitride film, an aqueous phosphoric acid solution formed of a high-purity phosphoric acid and deionized water at a high temperature of about 160° C. is used. However, since the aqueous phosphoric acid solution has a low etch selection ratio of the silicon nitride film relative to the silicon oxide film of 30 or less, it is difficult to apply the aqueous phosphoric acid solution to a lamination structure of the silicon nitride film and the silicon oxide film. In addition, since the silicon nitride film etching composition including a phosphoric acid is consistently concentrated by evaporation of moisture at a high temperature to affect the etch ratio of the nitride film and the oxide film, pure water (deionized water) should be consistently supplied. However, even in the case in which an amount of pure water to be supplied is changed a little, defects may be caused when removing the silicon nitride film.

For improving an etch selection ratio of the silicon nitride film to the silicon oxide film, a silicon nitride film etching composition in which a silicic acid is dissolved in a phosphoric acid may be used. However, the silicon nitride film etching composition produces precipitates during etching, and the thickness of the silicon oxide film is rather increased, which is an anomalous growth, and thus, it is difficult to apply the composition to a process.

Besides, a method of using a silicon compound containing an oxygen atom directly bonded to silicon to control an etch selection ratio may be used, but the etch selection ratio of the silicon nitride film relative to the silicon oxide film is not high and may produce precipitates, and thus, development of an etching composition to etch the silicon nitride film at a high selection ratio without occurrence of precipitates is needed.

Typical wet etching provides a low etch selection ratio of a silicon nitride film to a silicon oxide film and an etch selection ratio changed when using an etchant several times. In addition, during an etching process, precipitates occur and a thickness of a silicon oxide film is increased.

Thus, the present inventors intensively studied a silicon nitride film etching composition having a further improved etch selection ratio. As a result, the present inventors confirmed that when a treatment is performed with a phosphoric acid-based etchant composition including silsesquioxane as an additive, not only is an etch selection ratio for a silicon nitride film relative to a silicon oxide film significantly improved, but also an occurrence of precipitates is prevented and anomalous growth of other films including a silicon oxide film present around the silicon nitride film is remarkably decreased.

In addition, the present inventors found that since the silicon nitride film etching composition according to embodiments of the present invention shows a high selection for a silicon nitride film to a silicon oxide film and shows high stability even during etching at a high temperature of 150° C. or higher, an etch rate and an etch selection ratio for a silicon nitride film may be maintained for a long time in spite of an increased treatment time and the increased number of treatment, thereby completing embodiments of the present invention.

Hereinafter, the silicon nitride film etching composition according to embodiments of the present invention will be described in detail.

The silicon nitride film etching composition according to an example embodiment of the present invention, which is an etching composition having a high selection ratio for a silicon nitride film relative to a silicon oxide film, may include a phosphoric acid, silsesquioxane, and a residual amount of water.

In the silicon nitride film etching composition according to an example embodiment of the present invention, the silsesquioxane may be a compound represented by the following Chemical Formula 1:

$(R^1SiO_{3/2})_n$         [Chemical Formula 1]

wherein n is an integer of 6, 8, 10 or 12; and $R^1$ is independently of each other hydrogen, a halogen, cyano, nitro, hydroxy, $C_{1-20}$ alkyl, $C_{1-20}$ alkoxy, $C_3$-$C_{20}$ cycloalkyl, $C_3$-$C_{20}$ heterocycloalkyl, $C_3$-$C_{20}$ heteroaryl, $C_6$-$C_{20}$ aryl, $C_{1-20}$ aminoalkyl, or

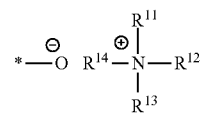

in which $R^{11}$ to $R^{14}$ are independently of one another hydrogen, $C_{1-20}$ alkyl, or $C_{1-20}$ hydroxyalkyl.

The silsesquioxane may be one or a mixture of two or more selected from the compound represented by Chemical Formula 1.

Specifically, the silicon nitride film etching composition according to embodiments of the present invention passivates a silicon oxide film, thereby suppressing corrosion and damage of the silicon oxide film during an etching process of a silicon nitride film. Furthermore, the silicon nitride film etching composition of the present invention is moved to the surface of the silicon oxide film and then adsorbed, thereby effectively suppressing the anomalous growth of the silicon oxide film simultaneously with protecting the surface of the silicon oxide film.

In addition, the silicon nitride film etching composition according to embodiments of the present invention includes a high content of a phosphoric acid, but may increase stability of the phosphoric acid to stably maintain a high selection ratio to the silicon nitride film and provide an advantage during an etching process at a high temperature.

The silicon nitride film etching composition according to an example embodiment of the present invention may include the silsesquioxane of Chemical Formula 1 wherein n is an integer of 6 or 8, and $R^1$ is independently of each other $C_{1-20}$ alkyl, $C_{1-20}$ aminoalkyl, or

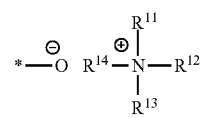

in which $R^{11}$ to $R^{14}$ are independently of one another hydrogen or $C_{1-20}$ alkyl.

The silicon nitride film etching composition according to an example embodiment of the present invention may include the silsesquioxane of Chemical Formula 1 wherein $R^1$ is independently of each other $C_{1-7}$ alkyl, $C_{1-7}$ aminoalkyl, or

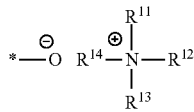

in which $R^{11}$ to $R^{14}$ are independently of one another hydrogen or $C_{1-7}$ alkyl.

The silicon nitride film etching composition according to an example embodiment of the present invention may include the silsesquioxane of Chemical Formula 1 wherein at least one of $R^1$ is

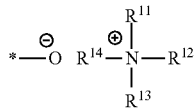

and the remaining is independently of each other $C_{1-7}$ alkyl, $C_{1-7}$ aminoalkyl, or

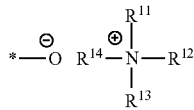

in which $R^{11}$ to $R^{14}$ are independently of one another hydrogen or $C_{1-7}$ alkyl.

As an example, when $R^1$ is $C_{1-7}$ aminoalkyl in Chemical Formula 1, the amino may include an amino group (*—NR'R") in which R' and R" may be independently of each other hydrogen or $C_{1-7}$ alkyl.

As an example, $C_{1-7}$ alkyl may be represented by *—$C_{1-7}$ alkyl-NR'R" in which R' and R" may be independently of each other hydrogen or $C_{1-7}$ alkyl.

As an example, the silsesquioxane of Chemical Formula 1 may include one or more selected from compounds represented by the following Chemical Formulae 2 and 3:

[Chemical Formula 2]

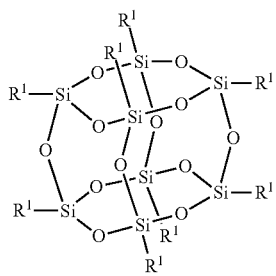

[Chemical Formula 3]

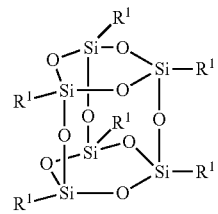

wherein
at least one of $R^1$ is

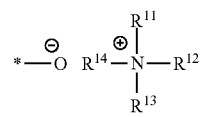

and the remaining is independently of each other $C_{1-7}$ alkyl, $C_{1-7}$ aminoalkyl, or

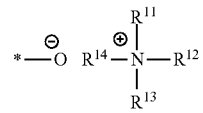

in which $R^{11}$ to $R^{14}$ are independently of one another hydrogen or $C_{1-7}$ alkyl.

The silicon nitride film etching composition according to an example embodiment of the present invention may include the silsesquioxane of Chemical Formula 1 wherein n is an integer of 6 or 8, and $R^1$ includes at least one

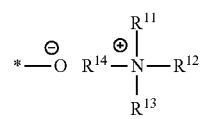

and at least one $C_{1-3}$ alkyl or $C_{1-3}$ aminoalkyl. Herein, $R^{11}$ to $R^{14}$ may be independently of one another hydrogen or a $C_{1-3}$ alkyl.

As an example, when $R^1$ is $C_{1-3}$ aminoalkyl in Chemical Formula 1, the amino may include an amino group (*—NR'R") in which R' and R" may be independently of each other hydrogen or $C_{1-7}$ alkyl.

As an example, the silsesquioxane of Chemical Formula 1 may have the following structure:
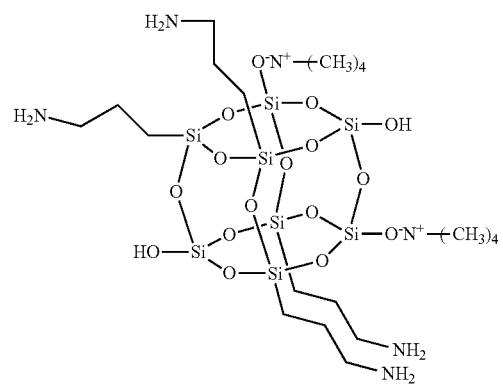
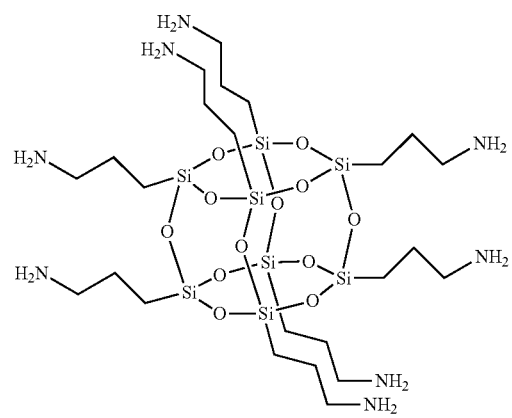
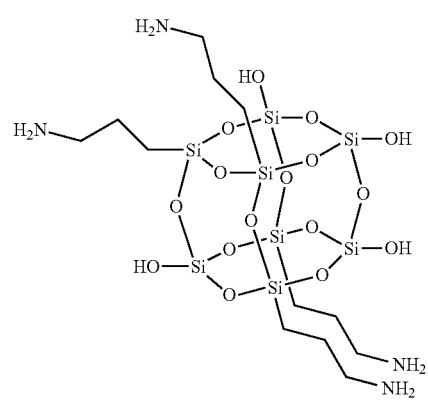
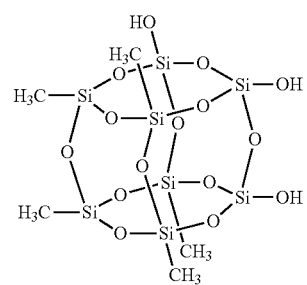
-continued
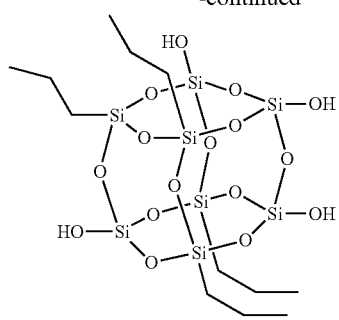
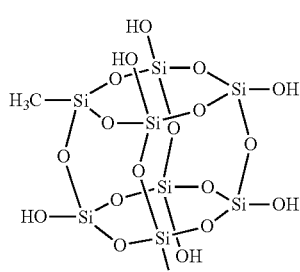
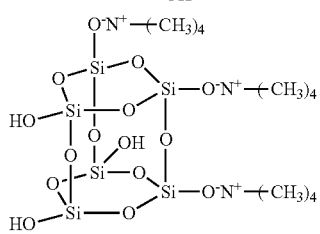
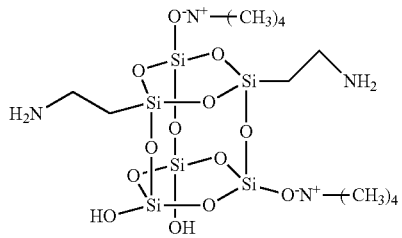
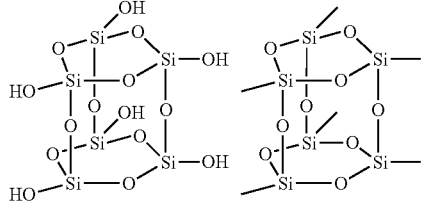
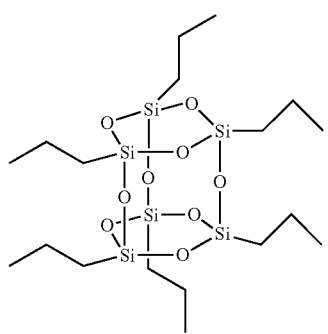

-continued

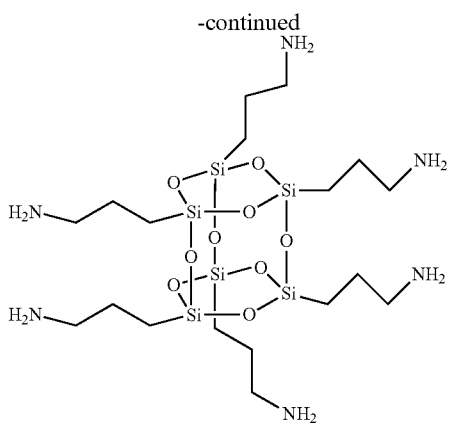

The silicon nitride film etching composition according to an example embodiment of the present invention may include the silsesquioxane of Chemical Formula 1 wherein n is an integer of 6 or 8, and $R^1$ includes at least one

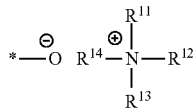

and at least one $C_{1-3}$ aminoalkyl. Herein, $R^{11}$ to $R^{14}$ may be independently of one another hydrogen or a $C_{1-3}$ alkyl. When the structural characteristics as such are satisfied, a remarkable etch selection ratio for the silicon nitride film is shown.

As an example, in Chemical Formula 1, $R^{11}$ to $R^{14}$ may be independently of one another hydrogen, methyl, ethyl, or n-propyl.

As an example, the silsesquioxane may be a liquid at room temperature.

As an example, the silsesquioxane may have a molecular weight in a range of 500 to 8,000.

In the silicon nitride film etching composition according to embodiments of the present invention, the silsesquioxane may be produced by a hydrolysis-polymerization method. However, the method is not limited to the polymerization method, and the hydrolysis-polymerization method may be carried out by a common method, of course.

As an example, the hydrolysis-polymerization method may include a step of reacting tetraammonium hydroxide with trialkoxy(alkyl)silane or trialkoxy(aminoalkyl)silane in an aqueous solution. Here, the tetraammonium hydroxide and the trialkoxy(alkyl)silane or trialkoxy(aminoalkyl)silane is introduced at a mole ratio of 1:0.1 to 1:10, and the step may be carried out in a temperature range of room temperature to 80° C.

As an example, the hydrolysis-polymerization method may include a step of reacting tetraalkylammonium hydroxide and tetraalkoxysilane in an aqueous solution and then further adding trialkoxysilane to perform the reaction. Here, the tetraalkylammonium hydroxide and the tetraalkoxysilane is introduced at a mole ratio of 1:0.1 to 1:10, the trialkoxysilane may be further introduced in a range of 0.1 to 20 mol, based on 1 mol of the tetraalkoxysilane, and the step may be carried out in a temperature range of room temperature to 80° C.

As an example, the tetraalkylammonium hydroxide may be selected from tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, hexadecyltrimethylammonium hydroxide, methyltributylammonium hydroxide, and the like.

As an example, the tetraalkoxysilane may be represented by the following Chemical Formula A:

$Si(OR^a)_4$             [Chemical Formula A]

wherein $R^a$ is hydrogen or $C_{1-3}$ alkyl.

As an example, the trialkoxysilane may be represented by the following Chemical Formula B:

$Si(OR^a)_3(R^b)$             [Chemical Formula B]

wherein $R^a$ is independently of each other hydrogen or $C_{1-3}$ alkyl; and $R^b$ is $C_{1-20}$ alkyl (space) or $C_{1-20}$ aminoalkyl.

The silicon nitride film etching composition according to an example embodiment of the present invention has a high etch selection ratio to the silicon nitride film. In addition, the silicon nitride film etching composition has a high stability at a high temperature, so that an etch rate drift is low even when being repeatedly used to provide a more stable etching process, thereby significantly reducing a defect rate.

An etching process using the silicon nitride film etching composition according to an example embodiment of the present invention may be performed at a process temperature of 100° C. or higher, specifically 100 to 500° C., and more specifically 150 to 300° C. As described above, the silicon nitride film etching composition of the present invention may maintain an initial composition ratio even during an etching process at a high temperature, has a small change in an etch rate and an etch selection ratio, and does not produce insoluble precipitates, thereby stably performing an etching process.

The silicon nitride film etching composition according to an example embodiment of the present invention may include 60 to 95 wt % of a phosphoric acid, 0.01 to 5.00 wt % of the silsesquioxane; and a residual amount of water, with respect to the total weight of the silicon nitride film etching composition.

The silicon nitride film etching composition according to an example embodiment of the present invention may include 60 to 90 wt % of a phosphoric acid; 0.05 to 3.00 wt % of the silsesquioxane; and a residual amount of water, more specifically, may include 75 to 90 wt % of a phosphoric acid; 0.10 to 2.00 wt % of the silsesquioxane; and a residual amount of water, and most specifically, may include 80 to 90 wt % of a phosphoric acid; 0.10 to 1.50 wt % of the silsesquioxane; and a residual amount of water.

When the silicon nitride film etching composition satisfying the range described above is used in an etching process, an effect of etching the silicon nitride film with a high etching selection is shown, an excellent etch rate and a high etching selection for the silicon nitride film may be maintained even after a repeated etching process, and there is no disadvantage during the etching process.

In addition, the silicon nitride film etching composition according to an example embodiment of the present invention may further include an alcoholic solvent. When the alcoholic solvent is added, the density of the silicon nitride film etching composition may be adjusted, and a stable effect may be obtained even at a high temperature of the semiconductor manufacturing process. In addition, even when the silicon nitride film etching composition is used several times, an etch rate change rate for the silicon nitride film is low so that process efficiency is good.

As an example, the alcoholic solvent may be any one or a mixture of two or more selected from the group consisting of methanol, ethanol, propanol, isopropanol, butanol, isobutanol, t-butanol, pentanol, hexanol, heptanol, octanol, ethylene glycol, propylene glycol, tetrahydrofurfuryl alcohol (THFA), and the like.

As an example, the alcoholic solvent may be included at 0.05 to 10 wt %, specifically 0.05 to 5 wt %, and more specifically 0.05 to 3 wt %, with respect to the total weight of the silicon nitride film etching composition.

In addition, the silicon nitride film etching composition according to an example embodiment of the present invention may further include an inorganic acid, a derivative thereof, or a combination thereof.

As an example, the inorganic acid may be one or produced from a mixture of two or more selected from inorganic acids such as a phosphoric acid, a polyphosphoric acid, a phosphorus acid, and a sulfonic acid (e.g., sulfuric acid) acid, or derivatives of the inorganic acids.

As an example, the polyphosphoric acid may be a polyphosphoric acid in which two molecules or more of phosphoric acids are condensed, and a non-limiting example thereof may include a pyrophosphoric acid, a tripolyphosphoric acid, and the like.

As an example, the derivative of the inorganic acid may be selected from trimethyl phosphate, triethyl phosphate, dimethylmethyl phosphonate, diethyl phosphite, dimethyl phosphonate, trimethylphosphite, diethylamine phosphate, methane sulfonic acid, p-toluene sulfonic acid, benzene sulfonic acid, aminomethyl sulfonic acid, sulfamic acid, and the like.

As an example, the inorganic acid, the derivative thereof, or the combination thereof may be included at 0.05 to 1 wt %, specifically 0.1 to 1 wt %, and more specifically, 0.3 to 0.8 wt %, with respect to the total weight of the silicon nitride film etching composition.

In addition, the silicon nitride film etching composition according to an example embodiment of the present invention may further include an ammonium-based compound. When the ammonium-based compound is added, a decrease in an etch rate and a change in a selection ratio are small even during long-term use, and an etch rate may be maintained constant.

As an example, the ammonium-based compound may be any one or a mixture of two or more selected from the group consisting of ammonia water, ammonium chloride, ammonium acetate, ammonium phosphate, ammonium peroxydisulfate, ammonium sulfate, ammonium fluorate, and the like, but is not limited thereto.

As an example, the ammonium-based compound may be included at 0.05 to 1 wt %, specifically, 0.1 to 1 wt %, and more specifically 0.3 to 0.8 wt %, with respect to the total weight of the silicon nitride film etching composition.

Water included in the silicon nitride film etching composition according to an example embodiment of the present invention is not particularly limited, but may be deionized water, more specifically deionized water for a process, and may have a resistivity value of 18 MΩ·cm or more.

The silicon nitride film etching composition according to an example embodiment of the present invention has a high selection ratio for a silicon nitride film relative to a silicon oxide film, and has a significant etch rate for the silicon nitride film.

The silicon nitride film etching composition according to an example embodiment of the present invention may have a silicon nitride film/oxide film etching ratio ($E_{SiNx}/E_{SiO2}$) of 500 or more.

As an example, the etch selection ratio ($E_{SiNx}/E_{SiO2}$) may be 700 or more.

As an example, the etch selection ratio ($E_{SiNx}/E_{SiO2}$) may be 1,000 or more.

As an example according to the present invention, the silicon nitride film etching composition may have an etch rate for the silicon nitride film of 20 to 500 i/min and an etch rate for the silicon oxide film of 0 to 0.5 Å/min.

As an example, the silicon nitride film etching composition may have an etch rate for the silicon nitride film of 40 to 500 i/min and an etch rate for the silicon oxide film of 0 to 0.4 Å/min.

As an example, the silicon nitride film etching composition may have an etch rate for the silicon nitride film of 60 to 450 k/min and an etch rate for the silicon oxide film of 0.05 to 0.35 Å/min.

In addition, the silicon nitride film etching composition according to an example embodiment of the present invention may have the etch rate drift of the silicon nitride film after a repeated etching process may satisfy the following Relation 1:

$$\Delta ERD_{SiNx} \leq 1\%$$ [Relation 1]

wherein $\Delta ERD_{SiNx}$ is an etch rate drift relative to an initial etch rate for a silicon nitride film.

The silicon nitride film etching composition has excellent stability to obtain a stable effect even at a high temperature of a semiconductor manufacturing process. In addition, even when the silicon nitride film etching composition is used several times, an etch rate change rate for the silicon nitride film is low so that process efficiency is good.

As an example, in the silicon nitride film etching composition, when the content of the silsesquioxane is 0.1 wt %, the etch rate drift of the silicon nitride film ($\Delta ERD_{SiNx}$) depending on an increase in the number of batches may be 0 to 0.8%, more specifically 0.01 to 0.5%, and most specifically 0.01 to 0.1%.

Hereinafter, a method of using the silicon nitride film etching composition according to embodiments of the present invention will be described in detail.

One embodiment of the method according to an example embodiment of the present invention may be a method of selectively etching the silicon nitride film as compared with the silicon oxide film.

Another embodiment may be a manufacturing method of a semiconductor device including an etching process of selectively etching a silicon nitride film.

The silicon nitride film may be various silicon nitride films such as a SiN film, SiON film, and a doped SiN film (doped SiN layer). As a concept including the silicon nitride film, as a specific example, it may refer to film quality which is mainly used as an insulating film when forming a gate electrode and the like. However, it may be used without limitation as long as the technical field has a purpose of selectively etching a silicon nitride film as compared with a silicon oxide film.

In addition, the silicon oxide film is not limited as long as it is a silicon oxide film commonly used in the art, and as an example, may be at least one or more films selected from the group consisting of a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LP-TEOS) film, a plasma enhanced tetraethyl orthosilicate (PETEOS) film, a high temperature oxide (HTO) film, a medium temperature oxide (MTO) film, an undoped silicate glass (USG) film, a spin on glass (SOG) film, an advanced planarization layer (APL) film, an atomic layer deposition (ALD) film, a plasma enhanced oxide (Pe-oxide) film, an $O_3$-tetraethyl orthosilicate (O3-TEOS) film, and the like. However, these are only a specific example, and the present invention is not limited thereto.

An etching method using the silicon nitride film etching composition according to an example embodiment of the present invention and a manufacturing method of a semiconductor device including the same may selectively etch only the silicon nitride film as compared with the silicon oxide film when the silicon nitride film and the silicon oxide film described above are mixed, has a high etch rate, and does not produce precipitates after etching to minimize a defect in the manufacture of a semiconductor device.

In addition, the silicon nitride film etching composition according to embodiments of the present invention has stability at a high temperature, thereby effectively suppressing a phenomenon that a phosphoric acid heated to a high temperature etches the silicon oxide film. Therefore, no precipitate by etching the silicon oxide film may occur to prevent substrate defects, and the silicon nitride film may be selectively etched to implement excellent semiconductor device characteristics.

A method of selectively etching the silicon nitride film as compared with the silicon oxide film, using the silicon nitride film etching composition described above, may be performed by a treatment method commonly used in the art. As a non-limiting example, it may be performed by a method of immersing a substrate in an etching composition solution, a spraying method, or the like.

As an example, the method may be performed at a process temperature of 100° C. or higher, specifically 100 to 500° C., and more specifically 100 to 300° C.

The method may be advantageous for selectively rapidly etching only the silicon nitride film as compared with the silicon oxide film and suppressing occurrence of precipitates, when the silicon oxide film, the silicon nitride film, a photoresist film, and the like formed on the substrate are mixed. Thus, according to embodiments of the present invention, an effective oxide film height may be effectively adjusted.

As the substrate, various materials, for example, silicon, quartz, glass, a silicon wafer, a polymer, a metal, a metal oxide, and the like may be used, but the present invention is not limited thereto. As an example of a polymer substrate, a film substrate such as polyethylene terephthalate, polycarbonate, polyimide, polyethylene naphthalate, and a cycloolefin polymer may be used, but is not limited thereto.

The silicon oxide film, the silicon nitride film, and the photoresist film may be formed with a single layer, a double layer, or multiple layers (a multilayer), respectively, but a lamination order is not limited in the case of a double layer or multiple layers.

A manufacturing method of a semiconductor device including an etching process of selectively etching a silicon nitride film, using the silicon nitride film etching composition may be also performed by the method commonly used in the art.

According to the manufacturing method of a semiconductor device, in a semiconductor device on which the silicon nitride film and the silicon oxide film are alternately laminated or mixed, selective etching to the silicon nitride film is possible and damage of the silicon oxide film is effectively suppressed, thereby minimizing damage of the silicon oxide film by etching to greatly improving stability, efficiency, and reliability of a semiconductor device manufacturing process. Here, the type of semiconductor device is not particularly limited in the present invention.

Accordingly, the etching method according to embodiments of the present invention may selectively remove the silicon nitride film laminated on the silicon oxide film and may maintain an etch rate and an etch selection ratio constantly in spite of an increased treatment time, thereby being efficiently applied to a process requiring selective etching of the silicon nitride film. In particular, the etching method according to embodiments of the present invention has suppressed precipitate occurrence and an effect of being excellent in effectively protecting the silicon oxide film, thereby securing stability and reliability of a process.

Hereinafter, the present invention will be described in more detail with reference to the Examples and Comparative Examples. However, the following Examples and Comparative Examples are only an example for describing the present invention in more detail, and do not limit the present invention in any way. Unless otherwise stated, the unit of temperature is ° C., and unless otherwise stated, the unit of an amount of a composition used is wt %.

(Evaluation Method)

1) Measurement of Etch Rate

Specifically, a silicon nitride film (SiN film) wafer and a silicon oxide film wafer were prepared, respectively, by the same deposition as that in a semiconductor manufacturing process by a chemical vapor deposition method. As the silicon nitride film wafer, an LI nitride (thickness: 500 Å) film was used and as the silicon oxide film wafer, a PE-TEOS (thickness: 300 Å) film was used.

An ellipsometer (available from J.A WOOLLAM, M-2000U) which is thin film thickness measuring equipment was used to measure a thickness of the composition before etching. The wafer was immersed in each of the compositions of the following Examples and the Comparative Examples which was maintained at an etching temperature of 160 to 230° C., for 30 minutes in a bath made of quartz, to proceed with an etching process. After etching was completed, washing is performed using ultrapure water, a drying device was used to completely dry a residual etchant solution and moisture, and the etch rate was measured.

The etch rate was calculated by dividing a difference in the thicknesses between before etching and after etching by an etching time (minute) using the ellipsometer, and an etch selection ratio calculated therefrom is shown in the following Table 2.

2) Measurement of Etch Rate Drift

A nitride film etch rate of the composition was measured by the method of measuring an etch rate above.

The etching process was set as one batch, and 10 batches were performed by repeating the process without exchange of the silicon nitride film etching composition to measure the etch rate drift ($\Delta ERD_{SiNx}$). The etch rate drift ($\Delta ERD_{SiNx}$) (%) was calculated by the following Equation 1. Here, the initial etch rate is an etch rate of one etching process.

$$\Delta ERD_{SiNx}=[1-\{(\text{etch rate when repeatedly performing etching process } n \text{ times or more})/(\text{initial etch rate})\}]\times 100 \quad \text{[Equation 1]}$$

The results are shown in the following Table 3.

3) Measurement of Whether or not Precipitates Occur

The surface of the silicon oxide film which was etched using the compositions of the following Examples and the Comparative Examples was measured using an electron scanning microscope (SEM) and it was confirmed whether precipitates occurred (○: occurred, x: not occurred).

The results are shown in the following Table 3.

4) Measurement of Oxide Film Anomalous Growth Occurrence Level (Å)

An ellipsometer (available from J.A WOOLLAM, M-2000U) which is thin film thickness measuring equipment was used to measure a difference between an oxide film thickness before etching and an oxide film thickness after etching using the compositions of the following Examples and the Comparative Examples. Here, a difference between the thicknesses before and after etching was evaluated as an anomalous growth thickness.

The results are shown in the following Table 3.

5) Structure Confirmation

The structure and the composition of the products of the following Preparation Examples were confirmed by $^1$H-NMR, $^{13}$C-NMR, and $^{29}$Si-NMR analyses. In addition, the stereostructure of the products was predicted by empirical potential structure refinement (EPSR) modelling. In addition, elemental analysis of the products was performed by an XPS spectrum (see Chem. Eur. J. 2014, 20, 15966-15974; Dalton Trans., 2008, 36-39; Phys. Chem. Chem. Phys., 2019, 21, 6732-6742).

Preparation Example 1

100 g of water was added to a 500 ml three neck flask equipped with a cooling tube and an agitator, 200 g of tetraethyl orthosilicate and 437.5 g of 20% aqueous tetramethylammonium hydroxide solution (mole of tetraethyl orthosilicate/mole of tetramethylammonium hydroxide=1) were added thereto, and stirring was performed at 70° C. for 3 hours. Thereafter, (N,N-diethyl-3-aminopropyl)triethoxysilane was added at a mole ratio of 1:1 with tetraethyl orthosilicate, stirring was performed at 30° C. for 12 hours, and then a vacuum pump was used at 60° C. to remove low-boiling point materials, thereby recovering the product.

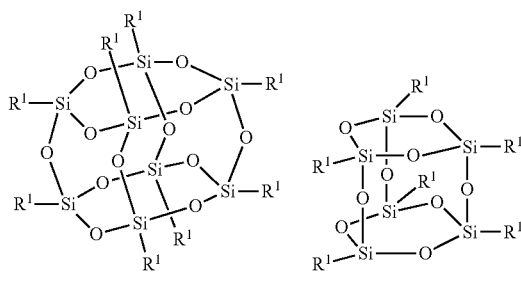

In the structure, $R^1$ is *—O$^-$N$^+$(CH$_3$)$_4$, *—OH, or *—(CH$_2$)$_3$N(CH$_2$CH$_3$)$_2$, and the mole ratio is 1:1:2.

Preparation Example 2

100 g of water was added to a 500 ml three neck flask equipped with a cooling tube and an agitator, 200 g of tetraethyl orthosilicate and 707 g of 20% aqueous tetraethylorthosilicate solution (mole of tetraethyl orthosilicate/mole of tetraethylammonium hydroxide=1) were added thereto, and stirring was performed at 70° C. for 3 hours. Thereafter, (N,N-diethyl-3-aminopropyl)triethoxysilane was added at a mole ratio of 1:2 with tetraethyl orthosilicate, stirring was performed at 30° C. for 12 hours, and then a vacuum pump was used at 60° C. to remove low-boiling point materials, thereby recovering the product.

In the structure shown in Preparation Example 1, $R^1$ is *—O$^-$N$^+$(CH$_3$)$_4$, *—OH, or *—(CH$_2$)$_3$N(CH$_2$CH$_3$)$_2$, and the mole ratio is 1:1:4.

Preparation Example 3

100 g of water was added to a 500 ml three neck flask equipped with a cooling tube and an agitator, 157.7 g of trimethoxy(propyl)silane and 437.5 g of 20% aqueous tetramethylammonium hydroxide solution (mole of trimethoxy(propyl)silane/mole of tetramethylammonium hydroxide=1) were added thereto, stirring was performed at 30° C. for 12 hours, and then a vacuum pump was used at 60° C. to remove low-boiling point materials to recover the product.

In the structure shown in Preparation Example 1, $R^1$ is *—O$^-$N$^+$(CH$_3$)$_4$ or *—OH, and the mole ratio is 1:1.

Preparation Example 4

100 g of water was added to a 500 ml three neck flask equipped with a cooling tube and an agitator, 200 g of tetraethyl orthosilicate and 976 g of 20% tetrapropylammonium hydroxide (mole of tetraethyl orthosilicate/mole of tetrapropylammonium hydroxide=1) were added thereto, and stirring was performed at 70° C. for 3 hours. Thereafter, (N,N-diethyl-3-aminopropyl)triethoxysilane was added at a mole ratio of 1:2 with tetraethyl orthosilicate, stirring was performed at 30° C. for 12 hours, and then a vacuum pump was used at 60° C. to remove low-boiling point materials, thereby recovering the product.

In the structure shown in Preparation Example 1, $R^1$ is *—O$^-$N$^+$(CH$_3$)$_4$, *—OH, or *—(CH$_2$)$_3$N(CH$_2$CH$_3$)$_2$, and the mole ratio is 1:1:4.

Examples 1 to 6 and Comparative Examples 1 to 4

Mixing was performed at the composition ratios described in the following Table 1, and stirring was performed at a speed of 500 rpm for 5 minutes at a room temperature to prepare a silicon nitride film etching composition. 300 g of each of the silicon nitride film etching compositions was prepared, with the content of water being a residual amount to make the total weight 100 wt %.

TABLE 1

| Classification | Phosphoric acid Content (wt %) | Silsesquioxane Type | Silsesquioxane Content (wt %) | Water | Process temperature (° C.) |
|---|---|---|---|---|---|
| Example 1 | 85 | Si-1 | 0.1 | Residual amount | 160 |
| Example 2 | 85 | Si-2 | 0.1 | Residual amount | 160 |
| Example 3 | 85 | Si-3 | 0.1 | Residual amount | 160 |
| Example 4 | 85 | Si-2 | 1.4 | Residual amount | 230 |
| Example 5 | 85 | Si-7 | 0.1 | Residual amount | 160 |
| Example 6 | 85 | Si-7 | 1.4 | Residual amount | 230 |

TABLE 1-continued

| Classification | Phosphoric acid Content (wt %) | Silsesquioxane Type | Silsesquioxane Content (wt %) | Water | Process temperature (° C.) |
|---|---|---|---|---|---|
| Comparative Example 1 | 85 | — | — | Residual amount | 160 |
| Comparative Example 2 | 85 | Si-4 | 0.1 | Residual amount | 160 |
| Comparative Example 3 | 85 | Si-5 | 0.1 | Residual amount | 160 |
| Comparative Example 4 | 85 | Si-6 | 0.1 | Residual amount | 160 |

Si-1: compound of Preparation Example 1
Si-2: compound of Preparation Example 2
Si-3: compound of Preparation Example 3
Si-4: tetraethyl orthosilicate
Si-5: (3-aminopropyl)triethoxysilane
Si-6: trimethoxy(propyl)silane
Si-7: compound of Preparation Example 4

TABLE 2

| Classification | Etch rate (Å/min) LP Nitride (SiNx) | Etch rate (Å/min) PE-TEOS (SiO$_2$) | Selection ratio ($E_{SiNx}/E_{SiO2}$) |
|---|---|---|---|
| Example 1 | 64.2 | 0.06 | 1070 |
| Example 2 | 60.6 | 0.04 | 1515 |
| Example 3 | 65.4 | 0.09 | 727 |
| Example 4 | 441.2 | 0.32 | 1379 |
| Example 5 | 58.8 | 0.04 | 1470 |
| Example 6 | 436.5 | 0.33 | 1323 |
| Comparative Example 1 | 71.2 | 3.30 | 22 |
| Comparative Example 2 | 66.7 | 0.05 | 1334 |
| Comparative Example 3 | 61.5 | 1.83 | 34 |
| Comparative Example 4 | 67.4 | 1.95 | 35 |

TABLE 3

| Classification | Number of batches | Nitride film etch rate (Å/min) | Nitride film etch rate drift (%) | Oxide film anomalous growth occurrence level (Å) | Whether precipitates occurred |
|---|---|---|---|---|---|
| Example 1 | 1 | 64.2 | — | 0 | X |
|  | 10 | 64.0 | 0.31% | 0 | X |
| Example 2 | 1 | 60.6 | — | 0 | X |
|  | 10 | 60.5 | 0.17% | 0 | X |
| Example 3 | 1 | 65.4 | — | 0 | X |
|  | 10 | 65.2 | 0.31% | 0 | X |
| Example 4 | 1 | 441.2 | — | 0 | X |
|  | 10 | 438.8 | 0.54% | 0 | X |
| Example 5 | 1 | 58.8 | — | 0 | X |
|  | 10 | 58.7 | 0.17% | 0 | X |
| Example 6 | 1 | 436.5 | — | 0 | X |
|  | 10 | 434.6 | 0.44% | 0 | X |
| Comparative Example 1 | 1 | 71.2 | — | 0 | X |
|  | 10 | 68.6 | 3.65% | 5 | ○ |
| Comparative Example 2 | 1 | 66.7 | — | 0 | ○ |
|  | 10 | 63.9 | 10.25% | 28 | ○ |
| Comparative Example 3 | 1 | 61.5 | — | 0 | X |
|  | 10 | 60.8 | 8.85% | 9 | ○ |
| Comparative Example 4 | 1 | 67.4 | — | 0 | X |
|  | 10 | 64.3 | 9.69% | 14 | ○ |

As shown in Tables 2 and 3, each of the silicon nitride film etching compositions according to embodiments of the present invention had an excellent initial etch selection ratio of the etching process of 700 or more. In particular, it was confirmed that the silicon nitride film etching composition including silsesquioxane including an aminopropyl group (functional group) had an initial etch selection ratio of the etching process of 1070 to 1515, and thus, may implement a significantly high etch selection ratio.

In addition, it was confirmed that though the silicon nitride film etching composition was reused several times by performing the etching process repeatedly, the etch rate drift for the silicon nitride film was significantly low. In particular, in all of the silicon nitride film etching compositions according to embodiments of the present invention, no precipitate occurred even with the repeated performance of the etching process, and the anomalous growth of the silicon oxide film did not occur.

However, the silicon nitride film etching compositions of Comparative Examples 1, 3, and 4 had an initial etch selection ratio of the etching process of less than 35, which was significantly lower than that of the Examples of the present invention. In addition, when the etching process was repeatedly performed, precipitates occurred in all Comparative Examples, and anomalous growth of the silicon oxide film occurred. In addition, the silicon nitride film etching composition in all Comparative Examples had an etch rate drift for the silicon nitride film of 3% or more due to repeated performance of the etching process, which was significant.

In summary, according to embodiments of the present invention, the silicon nitride film may be selectively etched with an excellent etch selection ratio, of course, and the etch rate drift is low even with multiple use to maintain initial etching ability, thereby significantly increasing production efficiency. In addition, in the etching process, film quality damage of the silicon oxide film is minimized and also production of precipitates may be effectively suppressed, thereby providing a high-quality semiconductor device.

The silicon nitride film etching composition according to embodiments of the present invention may highly selectively etch a silicon nitride film as compared with a silicon oxide film, and suppress an etch rate for the silicon oxide film to effectively adjust an effective field oxide height (EFK).

In addition, since the silicon nitride film etching composition according to embodiments of the present invention has an effect of having a small change in the etch rate and the etch selection ratio for a silicon nitride film, even with an increased etch treatment time or repeated use, productivity in a semiconductor manufacturing process for selectively etching a silicon nitride film may be eventually improved. In addition, the composition does not produce precipitates during etching at a high temperature, and also, does not cause anomalous growth in which the thickness of an oxide film is rather increased.

In addition, the silicon nitride film etching composition according to embodiments of the present invention may have excellent storage stability and maintain constant etch rate and etch selection ratio for a silicon nitride film even when it is used or stored for a long time.

In addition, the silicon nitride film etching composition according to embodiments of the present invention has an excellent effect of suppressing precipitate occurrence, when used in an etching process and a semiconductor manufacturing process.

It will be apparent to those skilled in the art to which the present invention pertains that the present invention is not limited to a to the above-mentioned example embodiments, and may be variously substituted, modified, and altered without departing from the scope and spirit of the present invention.

What is claimed is:

1. A silicon nitride film etching composition comprising: 60 to 90 wt % of a phosphoric acid, 0.01 to 5.00 wt % of a silsesquioxane, and a residual amount of water, with respect to a total weight of the silicon nitride film etching composition.

2. The silicon nitride film etching composition of claim 1, wherein the silsesquioxane is a compound represented by the following Chemical Formula 1:

  [Chemical Formula 1]

wherein n is an integer of 6, 8, 10 or 12; and $R^1$ is independently of each other hydrogen, a halogen, cyano, nitro, hydroxy, $C_{1-20}$ alkyl, $C_{1-20}$ alkoxy, $C_3$-$C_{20}$ cycloalkyl, $C_3$-$C_{20}$ heterocycloalkyl, $C_3$-$C_{20}$ heteroaryl, $C_6$-$C_{20}$ aryl, $C_{1-20}$ aminoalkyl, or

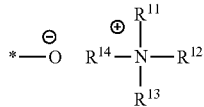

in which $R^{11}$ to $R^{14}$ are independently of one another hydrogen, $C_{1-20}$ alkyl, or $C_{1-20}$ hydroxyalkyl.

3. The silicon nitride film etching composition of claim 2, wherein in Chemical Formula 1, n is an is an integer of 6 or 8, and $R^1$ is independently of each other $C_{1-20}$ alkyl, $C_{1-20}$ aminoalkyl, or

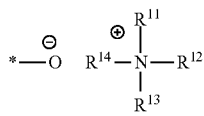

in which $R^{11}$ to $R^{14}$ are independently of one another hydrogen or $C_{1-20}$ alkyl.

4. The silicon nitride film etching composition of claim 2, wherein in Chemical Formula 1, $R^1$ is independently of each other $C_{1-7}$ alkyl, $C_{1-7}$ aminoalkyl, or

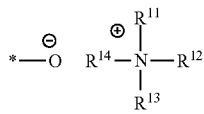

in which $R^{11}$ to $R^{14}$ are independently of one another hydrogen or $C_{1-7}$ alkyl.

5. The silicon nitride film etching composition of claim 2, wherein in Chemical Formula 1, at least one of $R^1$ is

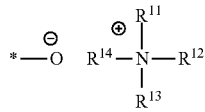

and the remaining is independently of each other $C_{1-7}$ alkyl, $C_{1-7}$ aminoalkyl, or

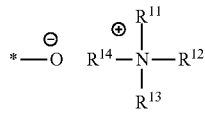

in which $R^{11}$ to $R^{14}$ are independently of one another hydrogen or $C_{1-7}$ alkyl.

6. The silicon nitride film etching composition of claim 1, further comprising: an alcoholic solvent.

7. The silicon nitride film etching composition of claim 1, further comprising: an inorganic acid, a derivative thereof, or a combination thereof.

8. The silicon nitride film etching composition of claim 1, further comprising: an ammonium-based compound.

9. The silicon nitride film etching composition of claim 1, wherein a silicon nitride film/oxide film etch selection ratio ($E_{SiNx}/E_{SiO2}$) of the silicon nitride film etching composition is 500 or more.

10. The silicon nitride film etching composition of claim 9, wherein an etch rate of the silicon nitride film etching composition for the silicon nitride film is 20 to 500 Å/min, and an etch rate of the silicon nitride film etching composition for the silicon oxide film is 0 to 0.5 Å/min.

11. The silicon nitride film etching composition of claim 10, wherein an etch rate drift of the silicon nitride film after a repeated etching process satisfies the following Relation 1:

$\Delta ERD_{SiNx} \leq 1\%$  [Relation 1]

wherein $\Delta ERD_{SiNx}$ is an etch rate drift relative to an initial etch rate for a silicon nitride film.

12. A method of selectively etching a silicon nitride film as compared with a silicon oxide film, using the silicon nitride film etching composition of claim 1.

13. A manufacturing method of a semiconductor device, the method comprising: an etching process performed using the silicon nitride film etching composition of claim 1.

* * * * *